United States Patent
Li

(10) Patent No.: US 12,092,666 B1
(45) Date of Patent: Sep. 17, 2024

(54) METHOD OF CURRENT MONITORING WITH TEMPERATURE COMPENSATION

(71) Applicant: INNOVISION SEMICONDUCTOR INC, Dongguan (CN)

(72) Inventor: Haiyin Li, Dongguan (CN)

(73) Assignee: INNOVISION SEMICONDUCTOR INC. (CN)

( * ) Notice: Subject to any disclaimer, the term of this patent is extended or adjusted under 35 U.S.C. 154(b) by 0 days.

(21) Appl. No.: 18/120,383

(22) Filed: Mar. 11, 2023

(51) Int. Cl.
*G01R 19/32* (2006.01)
*G01R 19/00* (2006.01)
*H01L 29/78* (2006.01)
*H03K 17/14* (2006.01)

(52) U.S. Cl.
CPC ......... *G01R 19/32* (2013.01); *G01R 19/0092* (2013.01); *H01L 29/7815* (2013.01); *H01L 29/7826* (2013.01); *H03K 17/145* (2013.01); *H03K 2217/0027* (2013.01)

(58) Field of Classification Search
CPC . G01R 19/32; G01R 19/0092; H01L 29/7815; H01L 29/7826; H03K 17/145; H03K 2217/0027
See application file for complete search history.

(56) References Cited

U.S. PATENT DOCUMENTS

2009/0057869 A1* 3/2009 Hebert .................. H01L 24/91
257/691

FOREIGN PATENT DOCUMENTS

CN 112601322 A * 4/2021 ........... H05B 45/325

* cited by examiner

*Primary Examiner* — Metasebia T Retebo
(74) *Attorney, Agent, or Firm* — Mark Luo

(57) ABSTRACT

A power stage, comprising of multiple power MOSFETs and control and monitoring circuits, is an important part of voltage regulators. The voltage regulator controller typically monitors the power stage output current to implement control and protection functions. Traditional power stages mostly adapt monolithic solutions, suffering from performance inefficiencies due to the LDMOS process, while co-packaged solutions with combined VDMOS and LDMOS processes suffer from potential large current monitoring errors due to different operating temperatures. The current invention proposes a current monitoring circuit with temperature compensation to cancel the temperature coefficient mismatch between the external power MOSFET and the current monitoring circuit. Therefore, the gain of the current monitoring circuit doesn't change with the temperature, allowing for high current monitoring precision, and the temperature compensation circuit doesn't affect the bandwidth of the current monitoring circuit, allowing the use of the output current monitoring signal for close-loop control and over-current protection.

1 Claim, 5 Drawing Sheets

(Preferred Embodiment)

(Preferred Embodiment)

METHOD OF CURRENT MONITORING WITH TEMPERATURE COMPENSATION

TECHNICAL FIELD

This invention relates to electronics, and more specifically, to current sensing of the power stage.

BACKGROUND

A voltage regulator is an electrical circuit used to regulate a DC voltage supplied to a load. Typically, the voltage regulator is implemented by a DC/DC converter such as a buck converter or boost converter. Additionally, a voltage regulator can be implemented by connecting in parallel multiple DC/DC converters in some high current applications such as multiphase voltage regulator in CPU power applications. To properly regulate the output voltage, the voltage regulator also requires other circuits, for example: gate driver circuit, controller circuit, sensing circuit, etc. Due to the area limitation of the print circuit board and the power density requirements, the complexity of voltage regulator keeps increasing. The main switch in a DC/DC converter, the gate driver circuit, and the sensing circuit can all be integrated into one single package, which is typically referred to as a "power stage".

FIG. 1 depicts the block diagram of a typical power stage chip and its external circuit 100. Two N-MOSFETs, 101 and 102, form a half-bridge circuit 103, which forms a DC/DC converter along with external components including an input capacitor 104, an inductor 105, and an output capacitor 106. The power stage controls the two N-MOSFETs based on the input PWM signal 107. A gate driver circuit 108 is needed to enhance the driver capability. The current monitoring circuit 109 measures the voltage at SW pin 110 and converts voltage into the output signal IMON 111. The temperature measure circuit 112 measures the temperature of the power stage and output the TMON signal 113. The gate driver circuit, current monitoring circuit, and the temperature monitoring circuit are usually power by an external 3.3V voltage source from VDD pin 114 that references to a signal ground AGND 115, while the half-bridge is typically powered by the 12V system input voltage 116 that references to the power ground PGND 117.

Most conventional power stages are based on monolithic technology, which means that all the circuits are implemented on a single die. Since the analog and digital circuits are mostly implemented by LDMOS process, such circuits' main switches, which comprise of two N-MOSFETs, must also adopt to LDMOS. Therefore, the current sensing MOSFET and the main switch MOSFET have the same temperature coefficient, and the current sensing output doesn't change when the temperature changes.

Compared to the LDMOS technology-based MOSFET, the VDMOS technology-based MOSFET has lower on-state resistance, lower switching loss, and smaller die size, which significantly benefits multiphase voltage regulator's performance. Therefore, power stage manufacturers tend to adopt VDMOS-based MOSFETs as the main switch. In connection with this technology trend, a manufacturer would then choose VDMOS die to fabricate the main switch MOSFETs but use LDMOS die to fabricate the auxiliary circuits including a gate driver circuit, current monitoring circuit, temperature monitoring circuit, etc. Then, both the VDMOS die and the LDMOS die are co-packaged into a single integrated circuit package. However due to the difference in the dies, the temperature coefficient of the current sensing MOSFET will not match the temperature coefficient of the main switches. This issue can lead to the changes in the current sensing gain along with the temperature changes. As a result, the output of the current monitoring circuit could change as the temperature changes and introduces a significant error to the control and monitoring system.

SUMMARY

In this invention, a novel temperature compensation circuit is introduced to the current monitoring circuit of the VDMOS and LDMOS co-packaged power stage to mitigate the temperature coefficient mismatch between the current monitoring circuit and the main switch MOSFET. With the proposed the solution, the gain of the current monitoring circuit would not experience significant changes as the temperature changes, thereby achieving high precision current monitoring. Meanwhile, the introduced circuit doesn't affect the bandwidth of the current monitoring circuit. Therefore, the current monitoring circuit can not only achieve fast local over-current protection, but also provide current sensing information for the system level control.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
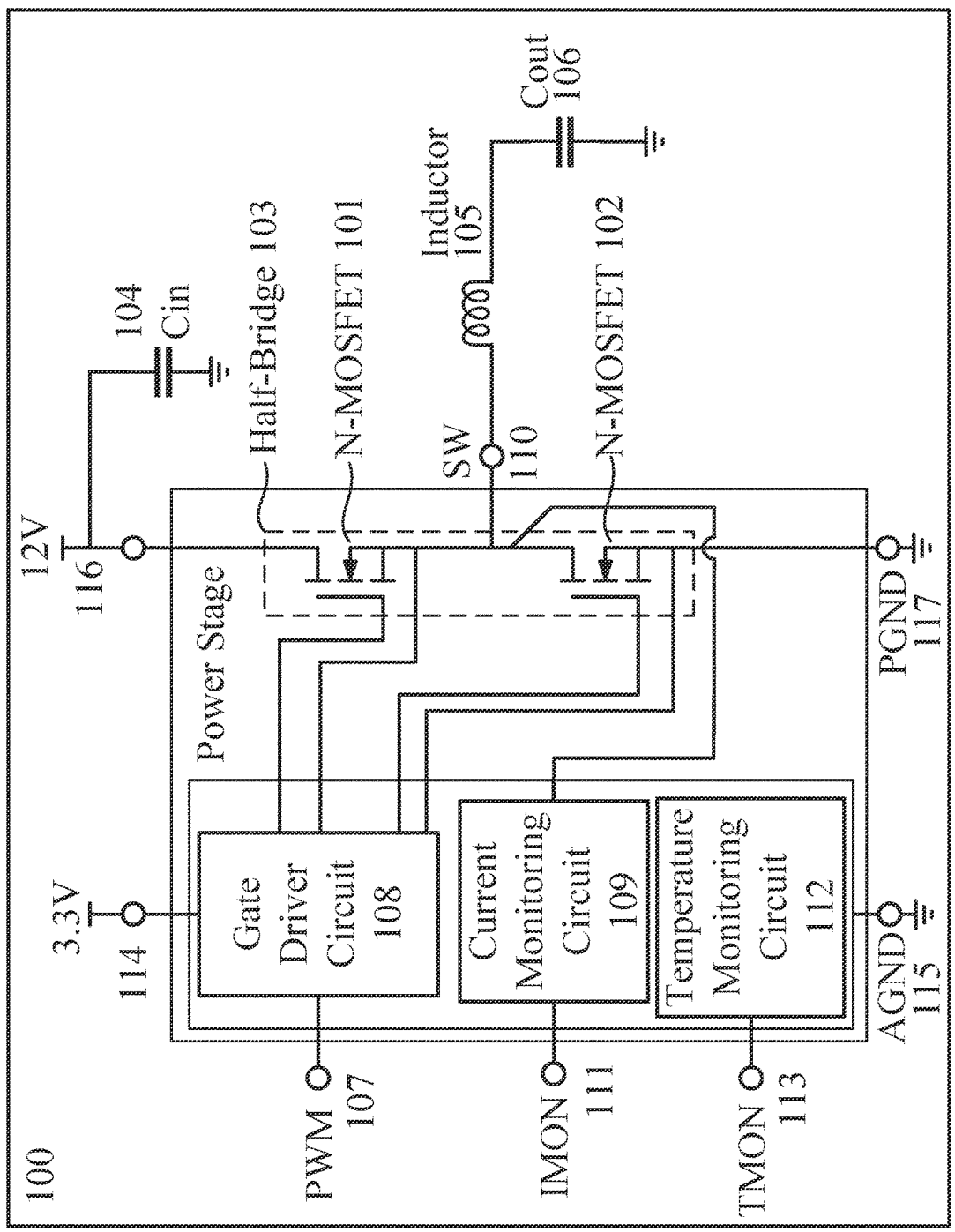
FIG. 1 illustrates an example of a typical power stage IC's block diagram with its external circuit.
Figure 2:
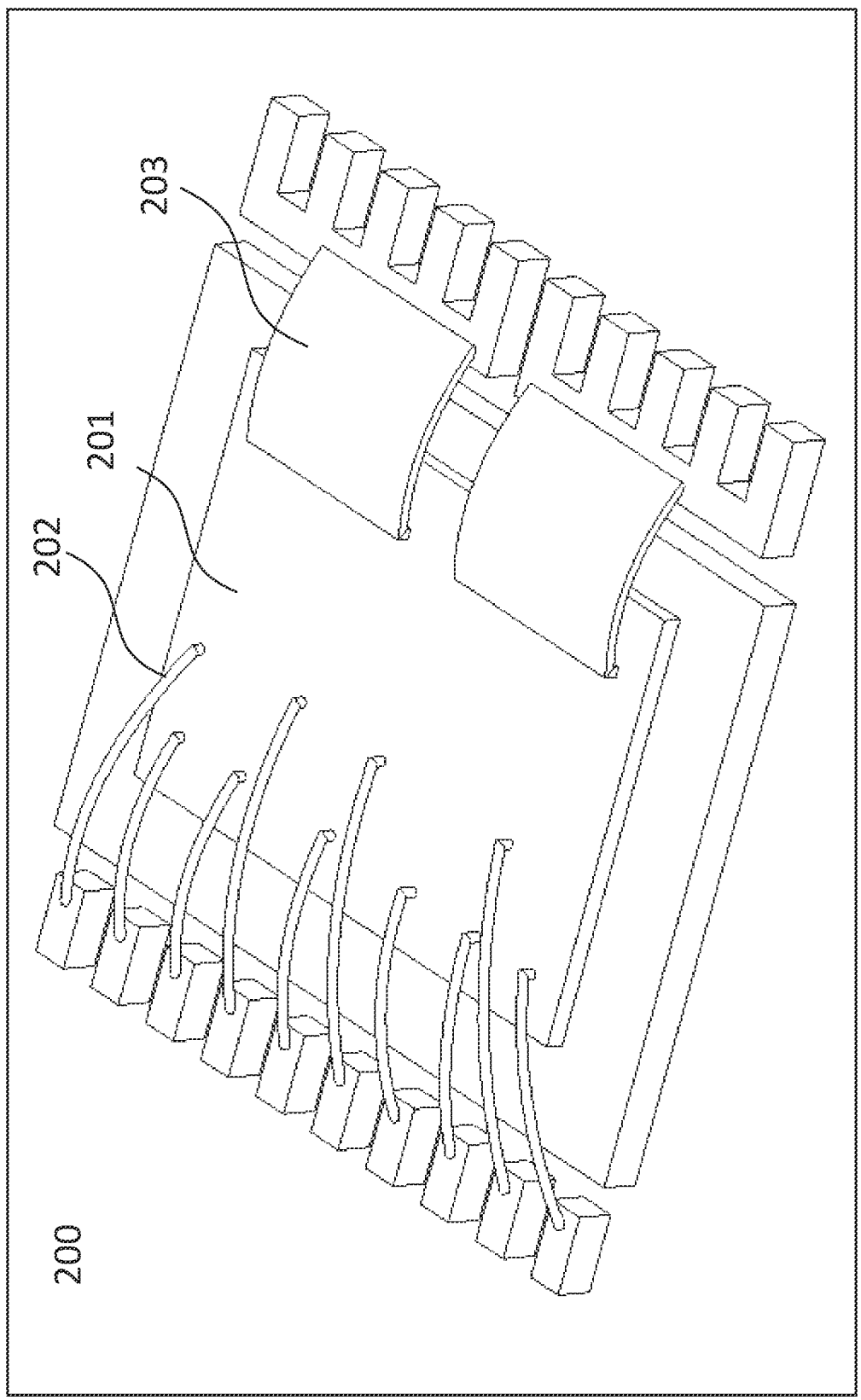
FIG. 2 illustrates an example implementation of an LDMOS based power stage.

FIG. 2 depicts an example of the packaging diagram of a monolithic power stage 200, which only includes one single die 201. Two N-MOSFETs as well as the gate driver circuit, the current monitoring circuit, and the temperature monitoring circuit are fabricated onto this die. Terminals on the die are wired out by bonding wires 202 and bonding ribbons 203. First, two N-MOSFETs and the current monitoring circuit are fabricated through the same LDMOS process, so that their temperature coefficients are very close. Second, the two N-MOSFETs and the current monitoring circuit are purposely located close together on the die, which will result in low temperature difference. Therefore, the current monitoring circuit can precisely measure the output current under different operating temperatures. However, the MOSFETs suffer performance degradation due to the disadvantages of the LDMOS structure.

Figure 3:
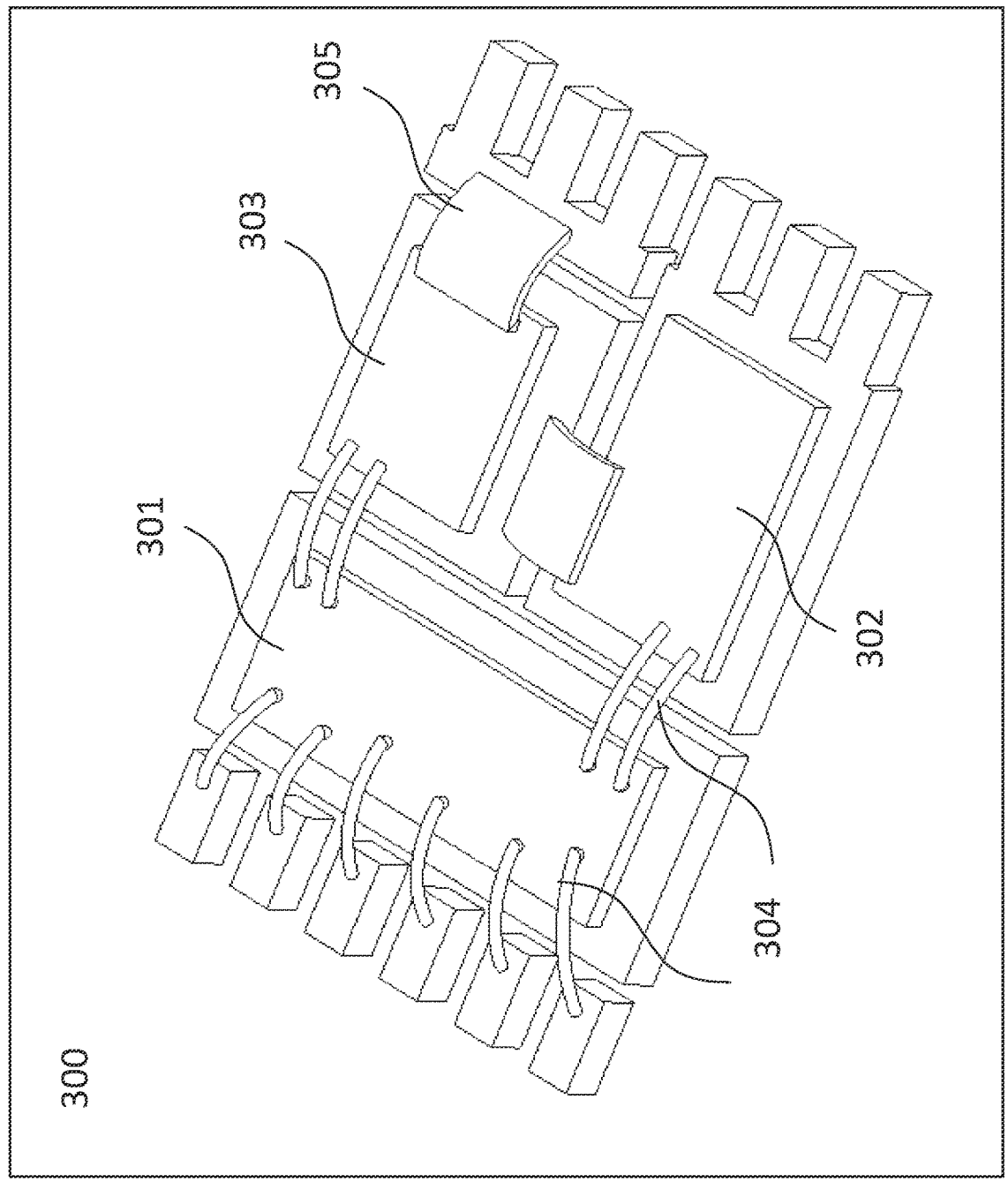
FIG. 3 illustrates an example implementation of an LDMOS and VDMOS co-packaged power stage.

FIG. 3 depicts an example of the packaging diagram of a co-packaged power stage 300, which includes multiple dies. The gate driver circuit, the current monitoring circuit, and the temperature monitoring circuit are implemented on the first die 301, which is fabricated through LDMOS process. Two N-MOSFETs are implemented on the second die 302 and the third die 303, which are fabricated through the VDMOS process. The interconnections between die terminals and package terminals are implemented by bonding wires 304 and bonding ribbons 305. Compared to the monolithic power stage, the co-packaged power stage shows better performance due to the two N-MOSFETs based on VDMOS process. However, since the MOSFETs and the current monitoring circuit are on separated dies, the temperature coefficient mismatch is inevitable, which results in precision degradation of the current monitoring.

Figure 4:
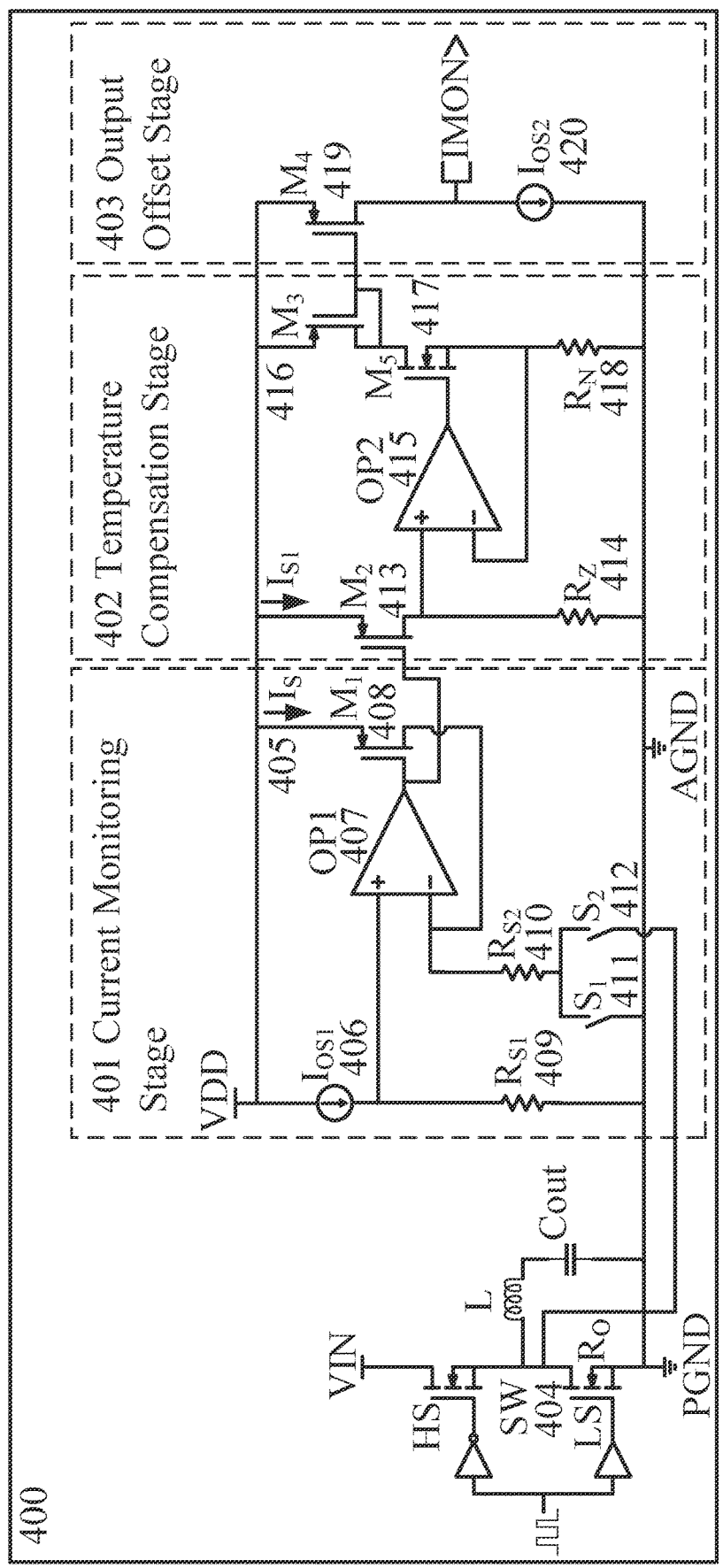
FIG. 4 illustrates an example of current monitoring circuit with temperature compensation in accordance with the invention.

FIG. 4 illustrate the detailed circuit diagram of the current monitoring circuit with the temperature compensation circuit 400. The proposed circuit comprises a current monitoring stage 401, a temperature compensation stage 402, and an output offset stage 403, which are all illustrated in detail below.

The current monitoring stage measures the voltage of the half-bridge's SW node 404 and converts the voltage into a current signal $I_S$ 405. First, the current monitoring stage comprises a reference current source $I_{OS1}$ 406, an operational amplifier OP1 407, a P-MOSFET M1 408, resistor $R_{S1}$ 409, resistor $R_{S2}$ 410, switch $S_1$ 411, and switch $S_2$ 412. The current source $I_{OS1}$ flow through the resistor $R_{S1}$ to generate a positive offset voltage for the op-amp's positive input $V_{p.op1}$. Therefore, $$V_{p.op1} = I_{OS1} \cdot R_{S1}$$

When half-bridge's low-side switch is on, switch $S_2$ also turns on and switch $S_1$ turns off. The voltage of the SW node is $$V_{SW} = -R_O \cdot I_L$$

where $I_L$ is the output current of the power stage and $R_O$ is the on-stage resistance of the low-side MOSFET.

The op-amp and the P-MOSFET form a current amplifier circuit. According to the principle of the operational amplifier, $V_{p.op1} = V_{n.op1}$. Therefore, $$V_{n.op1} = V_{SW} + R_{S2} \cdot I_S = -R_O \cdot I_L + R_{S2} \cdot I_S$$

where $I_S$ is the current flow through the P-MOSFET M1. Let $R_{S1} = R_{S2} = R_S$, $I_S$ can be written as $$I_S = I_{OS1} + \frac{R_O}{R_S} \cdot I_L$$

The temperature compensation stage comprises a P-MOSFET M2 413, a zero-temperature coefficient resistor $R_Z$ 414, an operational amplifier OP2 415, another P-MOSFET M3 416, an N-MOSFET M5 417, and a negative temperature coefficient resistor $R_N$ 418. The P-MOSFET M2 along with the P-MOSFET M1 form a current mirror circuit. Since M1 and M2 can be designed to have the same width and length on chip, the current flow through M2 is identical to the current flow through M1. Thus, the voltage at OP2's positive input Vp.op2 is $$V_{p.op2} = R_Z \cdot I_S$$

Op-amp OP2 and M5 forms a current amplifier circuit. According to the principle of the operational amplifier, $V_{p.op2} = V_{n.op2}$. Therefore, $$V_{n.op2} = R_Z \cdot I_S = R_N \cdot I_{S1}$$

where $I_{S1}$ is the current flow through M2. Since M3 and M5 are in the same branch, the current flow through M3 is also $I_{S1}$, which is $$I_{S1} = \frac{R_Z}{R_N} I_S = \frac{R_Z}{R_N} I_{OS1} + \frac{R_O R_Z}{R_S R_N} I_L$$

The output offset stage comprises a P-MOSFET M4 419 and a current source $I_{OS2}$ 420. The P-MOSFET M4 and the P-MOSFET M3 forms a current mirror circuit. Also, M4 and M3 can be designed to have the same width and length on chip, the current flow through M3 is identical to the current flow through M4. The current source $I_{OS2}$ can be designed to a fixed value, which is $$I_{OS2} = \frac{R_Z}{R_N} I_{OS1}$$

According to circuit law, the output current IMON is $$I_{MON} = I_{S1} - I_{OS2} = \frac{R_O R_Z}{R_S R_N} I_L$$

Assuming the temperature coefficients for $R_O$ is $\alpha_O$, temperature coefficient for $R_N$ is an, and temperature coefficient for $R_S$ is as, then $R_O$, $R_N$, and $R_S$ can be written as $$R_O = r_O(\alpha_O T + 1)$$

$$R_N = r_N(\alpha_N T + 1)$$

$$R_S = r_S(\alpha_S T + 1)$$

Where $r_O$, $r_N$, $r_S$ are constants and an is less than 0. Since $R_Z$ is zero temperature coefficient resistor, let $R_Z = r_Z$, where $r_Z$ is constant. Thus, the output current $I_{MON}$ can be written as $$I_{MON} = \frac{r_O(\alpha_O T + 1) r_Z}{r_S(\alpha_S T + 1) r_N(\alpha_N T + 1)} I_L = \frac{r_O r_Z(\alpha_O T + 1)}{r_S r_N (\alpha_S \alpha_N T^2 + (\alpha_S + \alpha_N)T + 1)} I_L$$

Since $\alpha_S$ and $\alpha_N$ are much smaller than 1, the second-order term is negligible. Then, $$I_{MON} = \frac{r_O r_Z(\alpha_O T + 1)}{r_S r_N((\alpha_S + \alpha_N)T + 1)} I_L$$

When $\alpha_S > \alpha_O$, $\alpha_S$ and an can be designed to satisfy $\alpha_S + \alpha_N = \alpha_O$. Thus, the temperature dependent terms are cancelled. Therefore, $$I_{MON} = \frac{r_O r_Z}{r_S r_N} I_L$$

As it is shown, the output current signal $I_{MON}$ is independent of temperature. When $\alpha_S < \alpha_O$, the proposed feature can be implemented by switching the position of $R_Z$ and $R_N$. The output current IMON becomes $$I_{MON} = \frac{r_O r_Z((\alpha_O + \alpha_N)T + 1)}{r_S r_N(\alpha_S T + 1)} I_L$$

By designing $\alpha_S$ and $\alpha_N$ to satisfy $\alpha_S=\alpha_N+\alpha_O$, the temperature dependent terms can also be cancelled.

Figure 5:
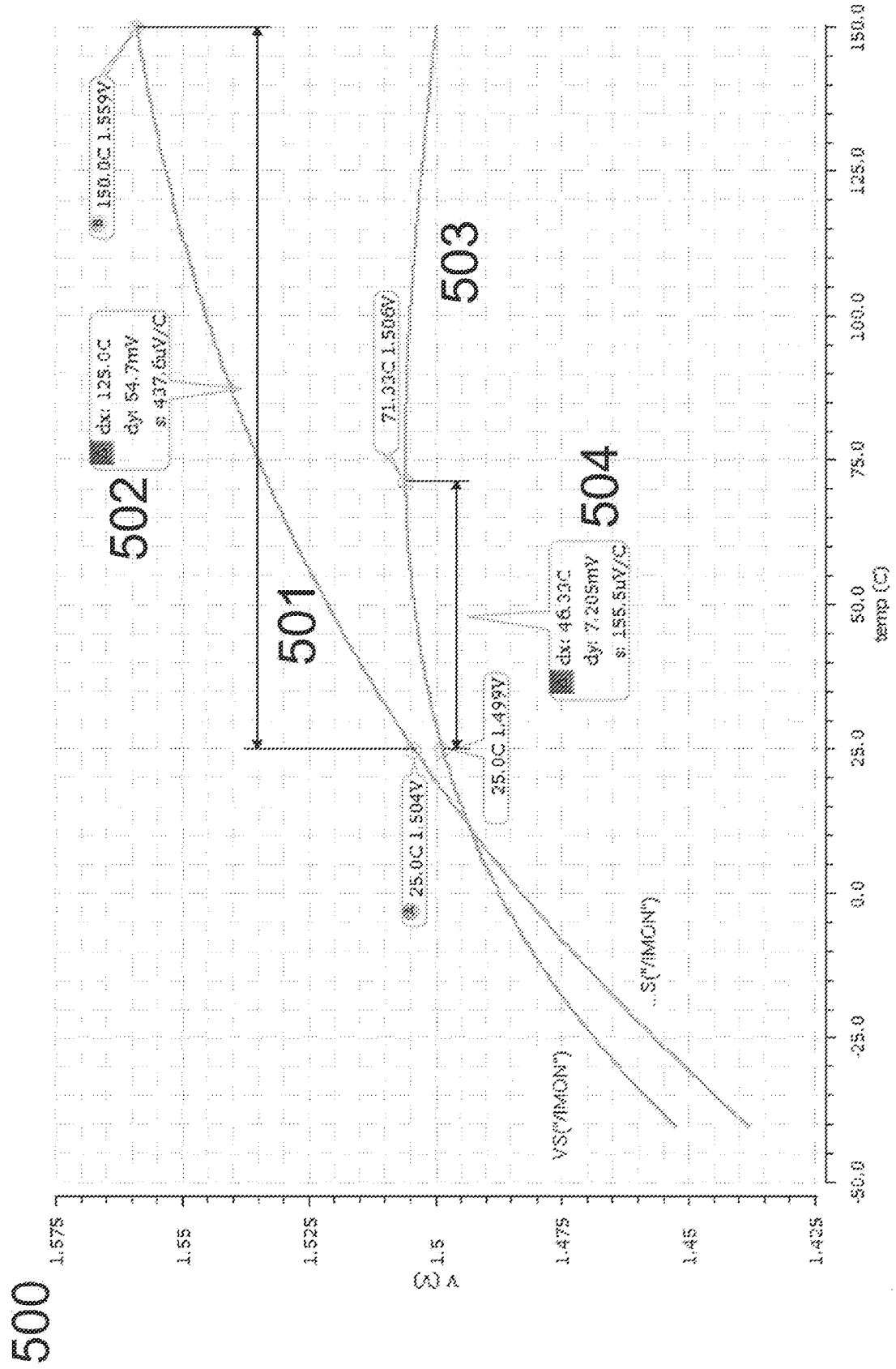
FIG. 5 illustrates a comparison of IMON output to temperature curve between uncompensated current sensing system and the compensated current monitoring system.

FIG. 5 illustrates a comparison of IMON output to temperature curve between uncompensated current sensing system and the compensated current monitoring system 500. The green curve 501 is the IMON output without temperature compensation. As it is shown, the output voltage variation can be as large as 54.7 mV 502. The red curve 503 is the IMON output with temperature compensation. As it is shown, the output voltage variation is only 7.2 mV 504.

What is claimed is:

1. A power stage integrated chip, comprising:
   a PWM pin, a PVIN pin, a VDD pin, an AGND pin, a PGND pin, an SW pin, and an IMON pin;
   two dies made of power MOSETs, fabricated using a VDMOS process;
   a third die containing control, logic, and analog circuits, fabricated using a LDMOS process, wherein the third die further comprises a current monitoring circuit to output a current source signal at the IMON pin based on the output current at the SW pin, wherein the current monitoring circuit further comprises:
   a first operational amplifier;
   a current source circuit and a resistor in series to generate a voltage reference to the positive input of the first operational amplifier;
   a second resistor with two terminals: a first terminal is connected to two switches, each of which connects to the SW pin and the AGND pin respectively, and a second terminal is connected to the negative input of the first operational amplifier;
   a first P-MOSFET with its gate connected to the output of the first operational amplifier, its source connected to the VDD pin and its drain connected to the negative input of the first operational amplifier;
   a second operational amplifier;
   a second P-MOSFET with its gate connected to the output of the first operational amplifier, its source connected to the VDD pin, and its drain is connected to the positive input of the second operational amplifier;
   a third resistor that connects between the positive input of the second operational amplifier and the AGND pin;
   a fourth resistor that connects between the negative input of the second operational amplifier and the AGND pin;
   a current mirror circuit implemented by two P-MOSFETs;
   an N-MOSFET with its gate is connected to the output of the second operational amplifier, its source connected to the negative input of the second operational amplifier, and its drain is connected to the input of the current mirror circuit;
   a second current source circuit that connects between the output of the current mirror circuit and the AGND pin; and
   an IMON terminal at the current mirror circuit's output; and
   bonding wires or other necessary conductors to interconnect among the three dies.

* * * * *